US008195995B2

(12) United States Patent
Janke et al.

(10) Patent No.: US 8,195,995 B2
(45) Date of Patent: Jun. 5, 2012

(54) INTEGRATED CIRCUIT AND METHOD OF PROTECTING A CIRCUIT PART OF AN INTEGRATED CIRCUIT

(75) Inventors: Marcus Janke, Munich (DE);
Korbinian Engl, Kirchasch (DE)

(73) Assignee: Infineon Technologies AG, Neubiberg (DE)

( * ) Notice: Subject to any disclaimer, the term of this patent is extended or adjusted under 35 U.S.C. 154(b) by 737 days.

(21) Appl. No.: 12/166,906

(22) Filed: Jul. 2, 2008

(65) Prior Publication Data
US 2010/0001757 A1   Jan. 7, 2010

(51) Int. Cl.
*G01R 31/3177* (2006.01)
*G01R 31/40* (2006.01)

(52) U.S. Cl. .................................. 714/728; 714/735
(58) Field of Classification Search ............................ None
See application file for complete search history.

(56) References Cited

U.S. PATENT DOCUMENTS

| | | | | |
|---|---|---|---|---|
| 4,454,503 A * | 6/1984 | Konrad | | 340/648 |
| 5,072,178 A * | 12/1991 | Matsumoto | | 714/724 |
| 5,390,189 A * | 2/1995 | Tateishi | | 714/728 |
| 5,946,247 A | 8/1999 | Osawa et al. | | |
| 6,550,049 B1 * | 4/2003 | Torii | | 716/13 |
| 6,717,235 B2 * | 4/2004 | Komoike | | 257/555 |
| 6,873,939 B1 | 3/2005 | Zerbe et al. | | |
| 6,962,294 B2 | 11/2005 | Beit-Grogger et al. | | |
| 7,106,091 B2 | 9/2006 | Gammel | | |
| 7,288,786 B2 | 10/2007 | Janke et al. | | |
| 7,529,999 B2 | 5/2009 | Janke et al. | | |
| 7,561,999 B2 * | 7/2009 | Iwamoto et al. | | 703/14 |
| 2002/0131225 A1 * | 9/2002 | Barrow et al. | | 361/103 |
| 2002/0149980 A1 * | 10/2002 | Wu et al. | | 365/201 |
| 2003/0132777 A1 | 7/2003 | Laackmann et al. | | |
| 2003/0205816 A1 * | 11/2003 | Janke | | 257/758 |
| 2005/0044403 A1 | 2/2005 | Kim | | |
| 2007/0025033 A1 * | 2/2007 | Ouchiyama | | 361/56 |
| 2007/0061637 A1 * | 3/2007 | Ward et al. | | 714/718 |
| 2007/0140485 A1 | 6/2007 | Ghigo et al. | | |

FOREIGN PATENT DOCUMENTS

| | | |
|---|---|---|
| DE | 195 19 453 B4 | 11/1995 |
| DE | 100 45 025 A1 | 4/2001 |
| DE | 100 44 837 C1 | 9/2001 |
| DE | 100 58 078 C1 | 4/2002 |
| DE | 102 06 368 C1 | 6/2003 |
| DE | 102 23 176 B3 | 1/2004 |
| DE | 10 2004 036 889 A1 | 2/2005 |
| DE | 202 21 536 U1 | 4/2006 |
| DE | 10 2005 042 790 A1 | 3/2007 |
| DE | 60 2004 008 516 T2 | 5/2008 |
| GB | 2 356 276 A | 5/2001 |
| KR | 1020050033780 A | 4/2005 |
| WO | WO-2007/091210 A2 | 8/2007 |

* cited by examiner

*Primary Examiner* — Jeffrey A Gaffin
*Assistant Examiner* — Dipakkumar Gandhi
(74) *Attorney, Agent, or Firm* — Dickstein Shapiro LLP

(57) ABSTRACT

A integrated circuit comprises a circuit part to be protected and protective lines located at least one wiring level of the integrated circuit. In addition, the integrated circuit comprises logical gates coupled to the protective lines, whereby a logic circuit is formed, and a processing unit implemented to detect a manipulation of the integrated circuit by applying test patterns to the logic circuit and verifying a logic output value of the logic circuit responsive to the test patterns.

25 Claims, 5 Drawing Sheets

INTEGRATED CIRCUIT AND METHOD OF PROTECTING A CIRCUIT PART OF AN INTEGRATED CIRCUIT

BACKGROUND

Embodiments of the invention relate to an integrated circuit comprising a circuit part to be protected, the integrated circuit comprising an analyzing protection, and to a method of protecting a circuit part of an integrated circuit. In order to obtain information about the functionality of an integrated circuit (IC) or in order to change data or signals on an integrated circuit, integrated circuits may be target of a manipulation attempt. Such a manipulation may be, for example, particularly severe for security-relevant integrated circuits. In general, all types of integrated circuits may be a target of a manipulation attempt. For example the functionality of an integrated circuit may be investigated by reverse engineering. An integrated circuit may be protected against such an undesired manipulation or analysis attempt by different means.

DETAILED DESCRIPTION

With reference to FIG. 1 to 4, embodiments are depicted which relate to an integrated circuit comprising a circuit part to be protected, and to a method of protecting a circuit part of an integrated circuit.

Figure 1:
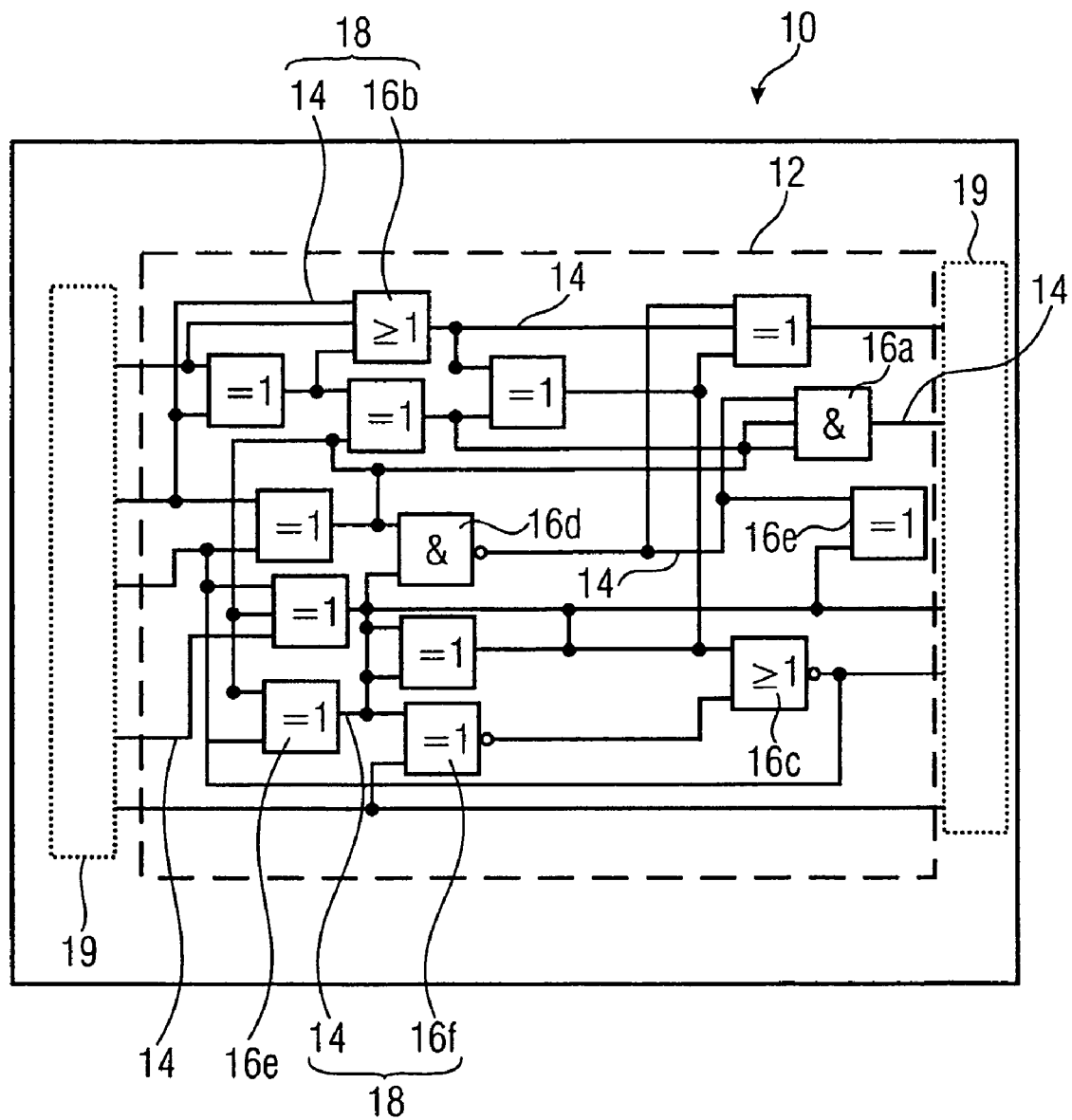
FIG. 1 shows a schematic representation of an integrated circuit comprising a circuit part to be protected comprising protective lines and logical gates which form, in accordance with an embodiment, a logic circuit, and a processing unit for detecting a manipulation of the integrated circuit.

FIG. 1 shows a schematic top view of an integrated circuit (IC) comprising a circuit part to be protected and a logic circuit which serves as manipulation or analysis protection. The integrated circuit 10 comprising a circuit part 12 to be protected in this embodiment comprises protective lines 14 located at least one wiring level of the integrated circuit. A wiring level may be a metallization level of a semiconductor chip, for example. Generally, a wiring level may have electrically conductive connections between circuit elements of the integrated circuit formed therein. In addition, the integrated circuit 10 comprises logical gates 16 coupled to the protective lines 14, thus forming a logic circuit 18. The integrated circuit 10 further comprises a processing unit 19 which may be formed to enable detection of a manipulation of the integrated circuit 10 or a tampering with the integrated circuit by applying a test pattern to the logic circuit 18 and verifying a logic output value of the logic circuit for the test pattern.

The integrated circuit 10, the protective lines 14, the logical gates 16 and the processing unit 19 thus may be jointly integrated onto a chip or microchip. The logic circuit depicted in FIG. 1 is randomly selected and merely serves to illustrate the present invention.

The gates may be elementary AND 16a, OR 16b, NOR 16c, NAND 16d, XOR 16e, XNOR 16f or NOT gates, as is schematically depicted in FIG. 1. These gates may be connected to form more complex logical sequential circuits or combinational circuits comprising feedback and storage possibilities.

The logic circuit 18 and/or the protective lines 14 may be arranged, for example, above the circuit part 12 to be protected and therefore serve as analysis protection or manipulation protection for the circuit part to be protected of the integrated circuit. The integrated circuit may be formed, for example, in a semiconductor substrate. The integrated circuit and the logical gates may be manufactured, for example, by means of a complementary metal oxide semiconductor (CMOS) technology. The logic circuit may prevent or at least complicate physical attacks as may occur, for example, by probing signals and pulses or by forcing signals and pulses onto functional lines of the integrated circuit for manipulating or analyzing data. Such attacks on an integrated circuit may be used, for example, to obtain confidential or internal data from the integrated circuit. This type of manipulations may be performed, e.g., on integrated circuits for chip cards, the manipulation altering, for example, the mode of operation of the integrated circuit, or data within its memory. Particularly with security-relevant integrated circuits as are employed, for example, for cash cards or cards with access authorization, this manipulation may lead to undesired consequences.

Manipulating, altering or probing data or signals, or analyzing the circuit may be achieved, for example, by placing probe tips directly onto conductor lines or circuit elements of the integrated circuit. What is also feasible is a manipulation of signals or memory contents of an integrated circuit by means of electric or magnetic fields. Manipulation may also be performed by means of electromagnetic radiation, such as laser light, for example. Manipulation of data or analysis of the circuit may be performed both from a first main surface 20' (FIG. 2) (top) of the chip in which the integrated circuit is formed, and from a second main surface 20" (rear) opposite the first main surface. Accordingly, it is also possible, in embodiments, for the protective lines to be arranged both at wiring levels on the first main surface and at wiring levels on the second main surface.

Figure 2:
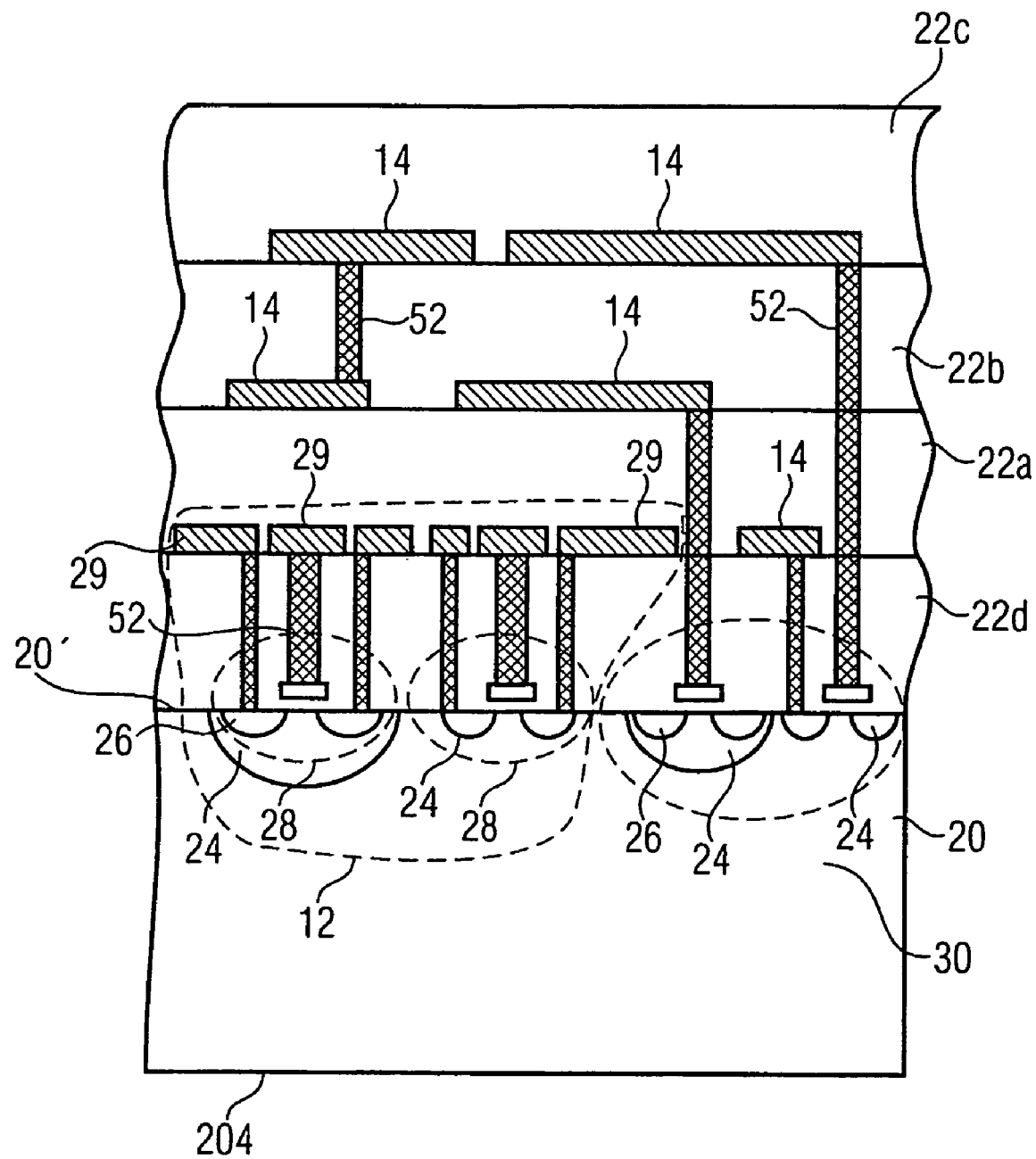
FIG. 2 shows a schematic detail of a cross-section of an integrated circuit in a semiconductor substrate and comprising several wiring levels, in accordance with an embodiment.

As is schematically shown in FIG. 1, in accordance with an embodiment, a circuit part 12 to be protected may comprise a multitude of protective lines 14 are formed, e.g., at a wiring level of the integrated circuit. In addition, the logic circuit 18 may comprise logical gates 16 by means of which the number of protective lines 14 may be increased in a zone of the integrated circuit comprising a circuit part to be protected. Along with the logical gates, the protective lines form a logic circuit by means of which a test pattern may be applied by a processing unit during functional operation of the integrated circuit. If an attempt is made to probe or analyze or manipulate signals and/or pulses of this logic circuit, or to force a signal onto the logic circuit, a logic output value of the logic circuit may change. By verifying the logic output value expected using the processing unit, manipulation, an attempted manipulation or a tampering with the integrated circuit may be detected. The logic circuit 18 may comprise purely random logic wiring as may be implemented in the course of an automated synthesis method of the integrated circuit. The integrated circuit may comprise different logical structures or devices, for example NAND, NOR, AND, OR, XOR gates, flip flops, multiplexers etc. A VHDL program code, which reflects the relationship and modes of operation of the respective devices, may be created by a compiling program, as a result of which an optimized circuit diagram—for example for optimized wiring paths—may form. On the basis of the circuit diagram designed, different mask levels and the various wiring levels for the integrated circuit may then be geometrically designed in the layout phase. Wiring levels may comprise unoccupied areas, i.e. areas where no conductor lines or connections that may be used for the actual function of the integrated circuit are arranged. The above-mentioned protective lines 14, and, in the semiconductor substrate, the logical gates 16 may then be formed in these unoccupied areas. The protective lines may thus be arranged in a first area of the at least one wiring level of the integrated circuit, and functional lines of the circuit part to be protected of the integrated circuit may be arranged in a second area of the at least one wiring level. This is schematically represented in FIG. 2. The expenses involved in realizing a multitude of protective lines may be reduced, in accordance with embodiments, in that active logical gates are coupled to the protective lines, so that when suitably selecting the logical gates, test patterns or test pattern signals may be applied to a multitude of protective lines. This large number of protective lines may then possibly be reduced again via active logical gates, and the test patterns thus may again be compressed for verification. By using the logical gates along with the protective lines for the logic circuit and the processing unit, a larger number of protective lines may thus be realized at the at least one wiring level of the integrated circuit, for example, using few transmit registers in the processing unit and using few receive registers, than in a protective structure comprising no logical gates. What may be important here is that the change in a protective line due to an attempted manipulation or a tampering with the integrated circuit may lead to an altered value in a receive register of the processing unit.

FIG. 2 shows details of a schematic cross-section through a semiconductor chip comprising an integrated circuit 10. For instance a p-type doped semiconductor substrate 20 may comprise, n-type doped troughs 24 and p-type doped areas 26 which, as is depicted in this example, form an inverter structure comprising respective p- and n-channel MOSFET transistors 28. These inverter structures may be, e.g., part of the circuit part 12 to be protected of the integrated circuit. The respective terminals of the MOSFET transistors 28 may be routed to metallization layers 29 at the first wiring level 22a via contactings 52, or into the first wiring level 22a via poly-silicon contacts. The metallization layers 29 may be functional lines 29 of the integrated circuit. The wiring layer 22a may be separated from the semiconductor substrate surface 20' by an insulating layer 22d comprising the contactings 52. The semiconductor substrate 20 may further include logical gate structures (here also depicted as an inverter structure 30, by way of example) formed therein. These logical gates may be coupled to the protective lines 14. In this embodiment the protective lines 14 being arranged at a second wiring level 22b and a third wiring level 22c, by way of example, and being arranged above the functional lines 29 of the circuit part to be protected. The protective lines 14 may at least partly overlap the functional lines 29 and the respective transistors 28 of the circuit part 12 to be protected. If an attempt is made, for example, to manipulate the circuit parts 12 to be protected using a probe tip, they are at least partly covered by the protective line 14. Any physical contact, interruption, short circuit or bridging, or any forcing of a signal onto the protective lines 14 may then cause a change in the logic output value of the logic circuit 18. The protective lines may be arranged such that they are arranged to at least partly overlap, at different wiring levels, with the circuit parts 12 to be protected of the integrated circuit. The inverter structure 30 schematically indicated in FIG. 2 may be part of a logical gate of the logic circuit 18. In an attempted manipulation, the processing unit and the test patterns may be implemented such that the processing unit may detect any interruption, short circuit or bridging of at least one of the protective lines by verifying the logic output value.

In other embodiments, the circuit part to be protected, or the functional signal lines 29 to be protected, of the integrated circuit may also be arranged at higher wiring levels of the chip. The protective lines 14 may also be arranged, at the same wiring level, adjacent to or between the circuit parts to be protected, or the functional lines 29 to be protected. However, the protective lines 14 may also be arranged at other wiring levels above or below the circuit parts to be protected, or the functional lines to be protected.

Logical signals or protective signals—the test patterns—may now be clocked, by means of a processing unit, in different combinations across the switchable active logical gates 16, and may be verified accordingly in a receive register, which may also be part of the processing unit. This means that a logic output value or several logic output values may be compared with a logic output value expected or with several logic output values expected, and if the logic output value expected deviates from the logic output value received, attempted manipulation may be concluded from this. By using logic gates, for example so-called exclusive-OR gates (XOR gates), a multitude of protective lines may be routed across the circuit part to be protected of the integrated circuit at a relatively small number of transmit register cells.

In accordance with an embodiment, the processing unit may comprise an input register and an output register, it being possible for the number of the register cells of the input register and/or of the output register to be smaller than the number of protective lines coupled to the input register and the output register via the logical gates. The logic circuit may thus comprise more protective lines than there are register cells in a transmit register. In contrast to simply increasing the number of protective lines, the number of protective lines across which different test patterns are running on account of the logical gates may be increased by using logical gates.

Multiplication or expansion of the protective lines locally on the integrated circuit may be effected where the circuit parts to be protected are arranged and an increased number of protective lines is desirable. Of course, it is also feasible for individual protective lines to not be expanded. In accordance with embodiments, the protective lines and the respective logical gates of the logic circuit for detecting a manipulation of the integrated circuit may be routed in an automated manner, routed in a semi-automated manner, or be manually be placed in the circuit and layout diagrams.

Figure 3A:
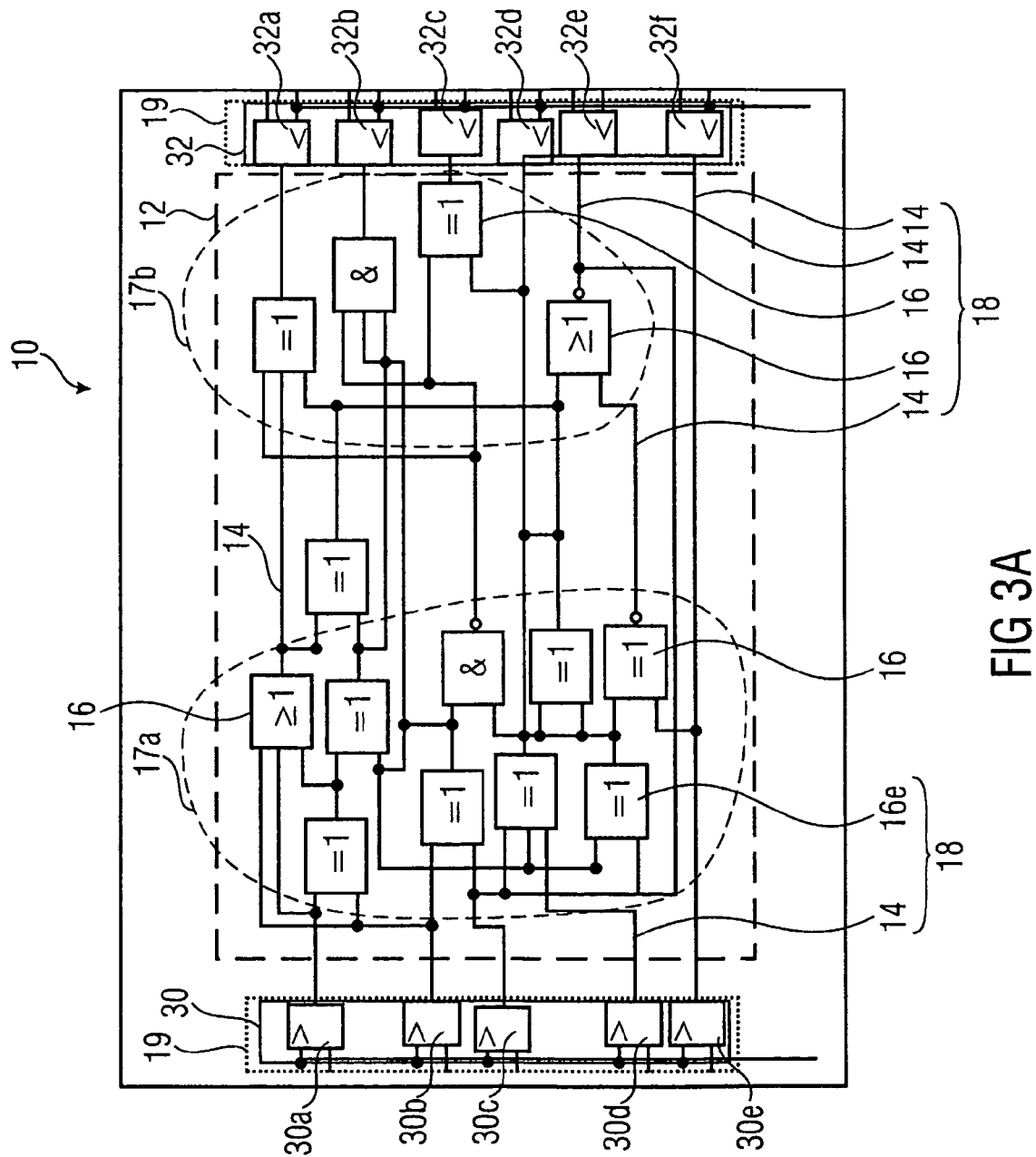
FIG. 3a shows, in accordance with a further embodiment, a schematic top view of an integrated circuit comprising a circuit part to be protected, the integrated circuit comprising a logic circuit and a processing circuit comprising input and output registers.
Figure 3B:
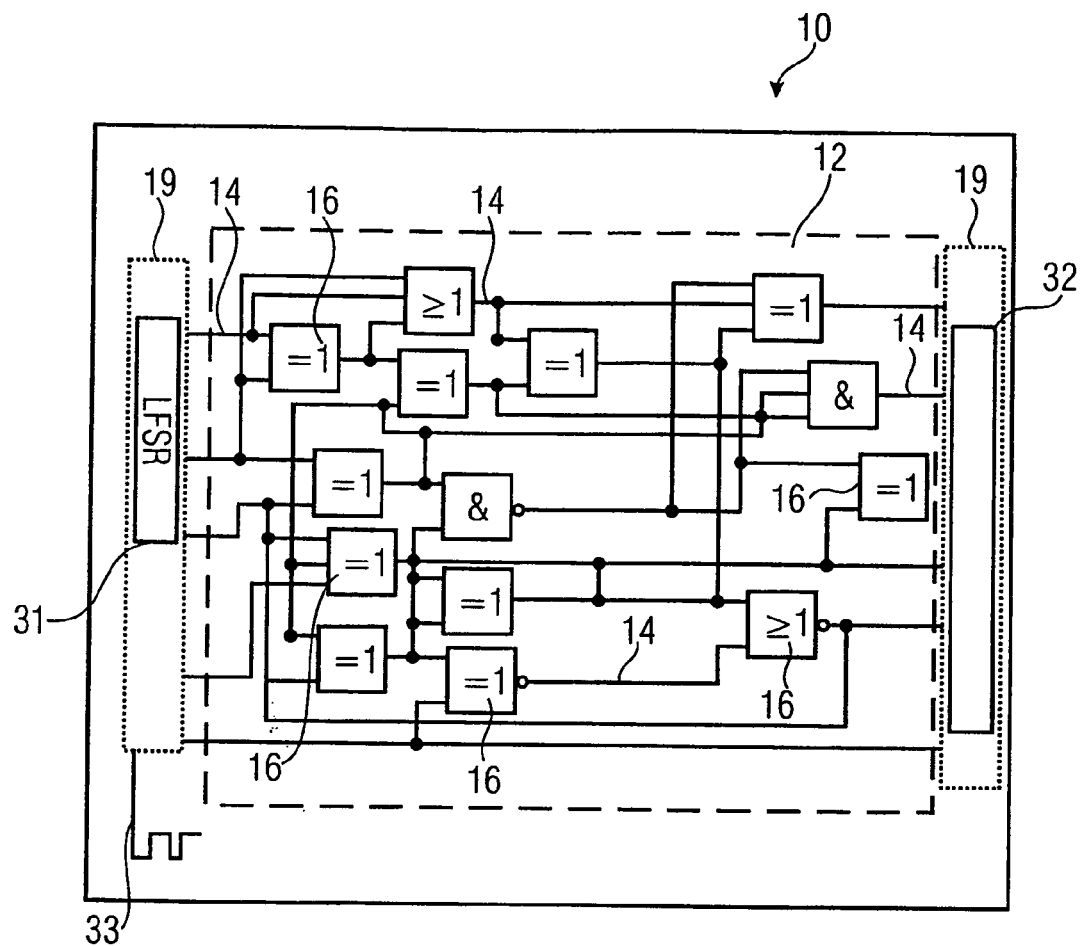
FIG. 3b shows the schematic top view of an integrated circuit comprising a circuit part to be protected, the integrated circuit comprising a logic circuit with a linear feedback shift register (LFSR) for creating pseudo-random test patterns for the protective logic circuit.

As is depicted in a schematic top view in FIG. 3a, an integrated circuit 10 may, e.g., comprise a processing unit 19 having an input register 30 with register cells 30a-e and an output register 32 with register cells 32a-f. The register cells may be formed as flip-flops. In addition, the protective lines 14 and the logical gates 16, which are intercoupled, together form the logic circuit 18. In this context, the logical gates 16 may again be used to increase the number of protective lines. The test patterns that may be stored in the input or transmit register 30, or may be generated there, may then be transmitted across the part 12 to be protected of the integrated circuit via these expanded protective lines 14. The processing unit 19 may comprise storage elements, for example the flip-flops, with the test patterns stored therein. The protective lines may be routed, for example, locally above a circuit part 12 to be protected of the integrated circuit.

In one embodiment, a test pattern may be routed, for example, from an 8-bit transmit register 30, across the circuit part to be protected, by means of expansion gates, which, e.g., may be XOR gates 16e combining individual bits. Expansion of the protective lines using the logical gates 16 may then be effected, for example, where more protective lines may be used for the integrated circuit. This may give rise to many short protective lines not enabling any mutual conclusions in terms of the mode of operation of the logical circuit 18. It is also possible for individual protective lines to not be expanded. After covering the circuit parts to be protected, the protective lines again may be compressed and coupled to an output register 32. In accordance with embodiments, verification of the logic output value or logic output values of the protective signals on the protective lines of the logic circuit in terms of a test pattern may be conducted in an output register 32, which may be part of the processing unit 19. In embodiments, verification of the logic output values in terms of a specific test pattern may also be performed using a computer program or, generally, software or a machine-readable code. In other words, both the creation and the verification of test patterns or test signals for the protective lines may be conducted using software, a computer program or a machine-readable code.

The processing unit for detecting a manipulation of the integrated circuit is implemented, in embodiments, such that any change or any manipulation of an individual or of several signals or of a logic value on the protective lines expanded by means of the logical gates leads to a change in the signals, which may be compressed again by means of logical gates. For this purpose, the exclusive-OR gate (XOR gate) may be used as a logical gate, for example. The compressed signals may then be supplied to the processing unit, i.e., for example, to the output register or the receive register 32. In embodiments, several test patterns may be routed across the protective device, i.e. the logic circuit for detecting a manipulation, so that any change in several protective lines may be more readily detected.

As is schematically represented in FIG. 3a, in one embodiment, in a first part 17a of the logical gates 16 of the logic circuit 18 across which, after applying test patterns, the test pattern run earlier than across a second part 17b of the logical gates, the number of protective lines may be increased as compared to the number of protective lines present before the first part 17a of the logical gates. In addition, across a second part 17b of the logical gates, the number of protective lines present after the second part 17b of the logical gates may be reduced as compared to the number of protective lines present before the second part 17b of the logical gates.

In another embodiment of the integrated circuit, the length of all of the protective lines of the logic circuit of the integrated circuit may be at least five times, or also at least ten times, the length of a longest dimension or side of the microchip wherein the integrated circuit 10 is formed. By using logical gates 16 and the associated expansion of the protective lines 14, the length of the protective lines available may be increased, and thus improved protection of the circuit parts to be protected of the integrated circuit may be achieved. Specific wiring of the logical gates and routing of the protective lines at the at least one wiring level may occur within the framework of a full-custom design or, for example, within the framework of a semi-custom design. While integrated circuits for conventional logic modules are created using the essentially manually controlled design (full-custom design), manual processing or influencing is more complicated with the synthesized logic. In this method, functions and relationships of objects may be formulated in a programming language such as VHDL or Verilog, for example, and may be translated into a finished wiring diagram by means of a compiling program.

In accordance with a further embodiment (FIG. 3b), the integrated circuit 10 may comprise a processing unit 19 having a feedback shift register (FSR). The feedback shift register may be implemented, for example, as a linear feedback shift register (LFSR). The linear feedback shift register 31 may be implemented to generate, with few control signals, pseudo-random test patterns for many protective signals. The LFSR may again be coupled to an output register 32, which may also be part of the processing unit 19, via the protective lines 14 and the logical gates 16. At the beginning, the LFSR may be loaded with different seed values, and a pseudo-random test pattern sequence for the logic circuit may be created using clocked control signals 33. The test patterns may be applied to the logic circuit in a serial or parallel manner and may be expanded, as was described above, by means of logical gates 16 so as to enable improved protection for the circuit parts 12 to be protected of the integrated circuit. Generally, the processing unit 19 may also comprise a random generator which may generate random or pseudo-random test patterns, i.e. test patterns which are still deterministic.

In accordance with several embodiments, the logic circuit for detecting a manipulation may also comprise storage elements implemented to latch a logical state of the logic circuit. In a more complex realization of the logic circuit, storing elements may thus also be used in the path of the protective lines 14. The storing element may be a register based on static random access memory (SRAM) cells or based on dynamic random access memory (DRAM) cells or other memory cells. In this manner, a kind of state machine may be realized, so that verification may be conducted as to whether a logic output value expected matches the logic output value or state value which is then generated by the state machine. In one embodiment, for example, a linear feedback shift register may be realized locally, as a result of which many protective signals are generated using few control signals. The logic, additionally implemented to this end, for the logic circuit for detecting any manipulation may be automatically tested in addition to the normal process execution, for example by an LFSR generated by a computer program such as TestCompress and having a high level of test coverage. This means that in embodiments, verification of the logic output values, which were generated, for example, by an LFSR, may be effected automatically, and this verification may also be performed simultaneously with the functional operation of the integrated circuit. The FSR or the LFSR may alternatively also be implemented by means of software.

Furthermore the processing unit 19 may also comprise storage elements having test patterns for the logic circuit 18 stored therein.

If, when verifying a logic output value of the logic circuit responsive to test patterns, a deviation of the logic output value from an expected logic output value occurs, the processing unit may output an alarm signal in embodiments. Comparison of a logic output value with an expected logic output value may either be implemented by hardware, or may also be effected by means of a computer program or using software or a machine-readable code.

In further embodiments, the logic circuit 18 may be implemented such that the test patterns which run across the protective lines of the logic circuit correspond to conventional test patterns usually generated for verifying logical circuits. These test patterns may then detect "stuck-at-1" errors or "stuck-at-0" errors, for example, in a manipulation or attempted manipulation of the protective lines or the logical gates of the logic circuit. The test patterns may be created automatically, for example, and be clocked in so-called scan chains across parts of the logical gates or across all of the logical gates of the logic circuit, and thus, "stuck-at-0" or "stuck-at-1" errors may be detected. The test patterns may comprise a random sequence of "0" and "1". The processing unit may be implemented and the test patterns may be selected such that an occurred "stuck-at-1" error or an occurred "stuck-at-0" error are recognizable at more than 90% of circuit nodes of the logic circuit, for example.

Figure 4:
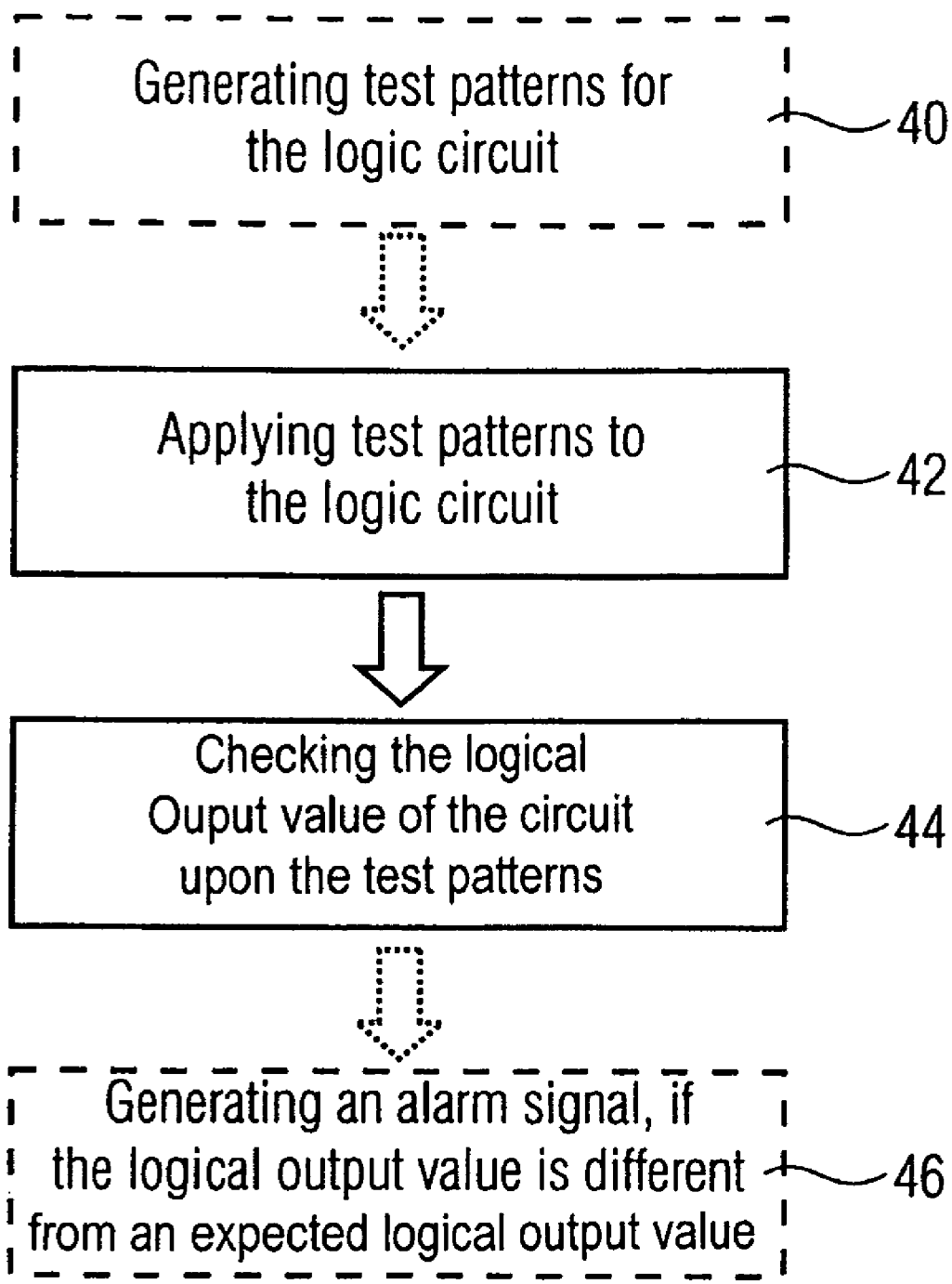
FIG. 4 shows a block diagram regarding the method of protecting a circuit part of an integrated circuit in accordance with an embodiment.

FIG. 4 depicts a flowchart in accordance with an embodiment of the method of protecting a circuit part of an integrated circuit. The method comprises applying a test pattern 42 to a logic circuit for detecting any manipulation of the integrated circuit, the logic circuit comprising logical gates coupled to protective lines located at least one wiring level of the integrated circuit. In addition, the method comprises verifying 44 a logic output value of the logic circuit responsive to test patterns.

As may be seen in FIG. 4, the method in accordance with embodiments may further comprise generating 40 a test pattern prior to applying 42 the test pattern. Optionally, the method in accordance with embodiments may comprise generating 46 an alarm signal if a deviation of a logic output value of the logic circuit in terms of a test pattern from an expected logic output value is detected. Verification may be performed in a processing unit, for example. It is also feasible for a monitoring signal to be created as long as no deviation of a logic output value of the logic circuit in terms of a test pattern from an expected logic output value is detected. Termination of the monitoring signal may then indicate a deviation of a logic output value of the logic circuit from an expected logic output value.

In embodiments of the method of protecting a circuit part of an integrated circuit, generating 40 test patterns may be effected, for example, using a feedback shift register of a processing unit, or by means of software or a computer program. The feedback shift register may be an LFSR. In other embodiments, generating test patterns may be effected in an automated manner and in such a manner as is done for verifying conventional logic circuits. The test patterns generated may be so-called scan chains, which are serially shifted across parts of the logical gates, or across all of the logical gates of the logic circuit in a clocked manner.

It shall be noted that applying test patterns and verifying an expected logic output value may be effected, in embodiments, simultaneously with functionally operating the integrated circuit. Verifying a logic output value of the logic circuit in terms of the test patterns may be effected, for example, by comparing a logic output value responsive to test patterns with an expected logic output value. For this purpose, the logic circuit may also comprise comparators, for example.

Verifying 44 a logic output value may also be performed by comparing a logic output value responsive to test patterns with an expected logic output value from a table of values, or truth table, or look-up table, or by means of a table of values for generating the comparison value. It is also conceivable for the verification 44 further to comprise calculating an expected logic output value as a function of the test patterns and subsequently comparing the logic output value responsive to test patterns with the expected logic output value calculated. It shall further be noted that the values of an input register or transmit register may be different from the values of an output or receive register. The comparison values or the expected logic output values may be determined, for example, by means of a mathematical formula or by means of a specific logical specification. The logic output values expected may thus be deterministically inferred as a function of the test pattern applied, or are specified, and may be compared, accordingly, to the logic output values received.

In particular, it shall therefore also be noted that the method may also be implemented as software, depending on the conditions. Implementation may be effected on a digital storage medium, in particular a disk, a CD or DVD comprising electronically readable control signals which may cooperate with a programmable computer system such that the respective method is performed. Generally, the invention thus also consists in a computer program product having a program code, stored on a machine-readable carrier, for performing the method, when the program code is executed on a computer. In other words, the invention may thus be realized as a computer program having a program code for performing the method, when the program code is executed on a computer.

In accordance with one embodiment, for example, an 8-bit transmit register may be routed on several expansion gates, which may be XOR gates, for example, with which individual bits may be combined. The expanded values are then routed across more than 8 protective lines across the area to be protected of the integrated circuit. In addition, the expansion of the protective lines using the logical gates may be locally performed where more protective lines may be used for the integrated circuit. As was already mentioned above, there is no need to expand all of the protective signals.

After covering the areas to be protected of the integrated circuit, the protective lines may be compressed again using logical gates. What is important is that a change in the expanded signals leads to a change in the compressed signals. This change may relate to individual or several signals. The signals compressed may then be supplied to the receive register. In this embodiment, the receive register again may be an 8-bit receive register.

Embodiments relate to an integrated circuit comprising a circuit part to be protected, the integrated circuit comprising an analyzing protection, and to a method of protecting a circuit part of an integrated circuit.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An integrated circuit comprising:
   a circuit part to be protected;
   protective lines located at least one wiring level of the integrated circuit, the protective lines being uncoupled from functional lines of the circuit part;
   logical gates coupled to the protective lines, as a result of which a logic circuit is formed; and
   a processing unit configured to detect a manipulation of the integrated circuit by applying test patterns to the logic circuit and verifying a logic output value of the logic circuit responsive to the test patterns.

2. The integrated circuit as claimed in claim 1, wherein the logic circuit comprises an input register and an output register, and wherein the number of register cells of the input register and/or of the output register is smaller than the number of protective lines coupled to the input register and the output register via the logical gates.

3. The integrated circuit as claimed in claim 1, wherein the processing unit comprises a feedback shift register (FSR) configured to generate pseudo-random test patterns, and apply the pseudo-random test patterns to the logic circuit.

4. The integrated circuit as claimed in claim 1, wherein the logical gates comprise exclusive-OR gates (XOR gates).

5. The integrated circuit as claimed in claim 1, wherein the protective lines are arranged in a first area of the at least one wiring level of the integrated circuit, and the functional lines of the circuit part are arranged in a second area of the at least one wiring level.

6. The integrated circuit as claimed in claim 1, wherein the logic circuit comprises random logical wiring.

7. The integrated circuit as claimed in claim 1, wherein the integrated circuit comprises at least one further wiring level, the at least two wiring levels being arranged one above the other, and wherein the protective lines are formed in a region of the wiring levels which laterally overlaps with the circuit part.

8. The integrated circuit as claimed in claim 1, wherein the logic circuit for detecting a manipulation of the integrated circuit comprises storage elements implemented to latch a logical state of the logic circuit.

9. The integrated circuit as claimed in claim 1, wherein the processing unit and the test patterns are implemented such that the processing unit may detect any interruption, short circuiting or bridging of at least one of the protective lines by means of the verification of the logic output value.

10. The integrated circuit as claimed in claim 1, wherein the processing unit is implemented to output an alarm signal if during verification of the logic output value the logic circuit responsive to the test pattern reveals a deviation of the logic output value from a expected logic output value.

11. The integrated circuit as claimed in claim 1, wherein the processing unit comprises a storage element having the test patterns stored therein.

12. The integrated circuit as claimed in claim 1, wherein the length of all of the protective lines of the logic circuit is at least ten times the length of a longest side of a chip comprising the integrated circuit.

13. The integrated circuit as claimed in claim 1, wherein the processing unit is implemented and the test patterns are selected such that an occurred "stuck-at-1" error and an occurred "stuck-at-0" error are recognizable at more than 90% of circuit nodes of the logic circuit by verifying the logic output value of the logic circuit responsive to the test patterns.

14. The integrated circuit as claimed in claim 1, wherein the protective lines and the logical gates are jointly integrated within a microchip.

15. The integrated circuit as claimed in claim 1, wherein the logical gates are configured so that during operation of the integrated circuit test patterns are clocked across parts of the logical gates coupled to the protective lines in order to detect a manipulation of the integrated circuit.

16. The integrated circuit according to claim 1, wherein the logical gates are coupled to the protective lines in a zone of the integrated circuit comprising a circuit part to be protected, and wherein by means of the logic gates the number of protective lines in the zone of the integrated circuit comprising the circuit part to be protected is larger than in a protective structure comprising no logical gates.

17. A method of protecting a circuit part of an integrated circuit, comprising:
applying test patterns to a logic circuit in order to detect a manipulation of the integrated circuit, the logic circuit formed by logical gates coupled to protective lines located at least one wiring level of the integrated circuit, the protective lines being uncoupled from functional lines of the circuit part, and
verifying a logic output value of the logic circuit responsive to the test patterns.

18. The method as claimed in claim 1, further comprising generating the test patterns prior to applying the test patterns to the logic circuit by use of a feedback shift register (FSR).

19. The method as claimed in claim 17, wherein the applying the test patterns and the verifying a logic output value are performed simultaneously with functionally operating the circuit part.

20. The method as claimed in claim 17, wherein the verifying the logic output value is performed by comparing the logic output value with an expected logic output value for the test patterns.

21. The method as claimed in claim 17, wherein the verifying the logic output value is performed by comparing the logic output value with an expected logic output value, and looking up the expected logical output value in a look-up table using the test patterns as in index to the look-up table.

22. The method as claimed in claim 17, wherein the verifying further comprises calculating an expected logic output value as a function of the test pattern, and comparing the logic output value with the expected logic output value calculated.

23. The method as claimed in claim 17, further comprising sending out an alarm signal if upon verifying the logic output value of the logic circuit responsive to test patterns, a deviation of the logic output value from an expected logic output value occurs.

24. The method according to claim 17, wherein the test pattern are applied to a logic circuit formed by logical gates, which are coupled to protective lines in a zone of the integrated circuit comprising a circuit part to be protected, and wherein by means of the logic gates the number of protective lines in the zone of the integrated circuit comprising the circuit part to be protected is larger than in a protective structure comprising no logical gates.

25. A non-transitory computer program product comprising a program code for performing a method of protecting a circuit part of an integrated circuit, the method comprising:
applying test patterns to a logic circuit for detecting a manipulation of the integrated circuit, the logic circuit comprising logical gates coupled to protective lines located at least one wiring level of the integrated circuit, the protective lines being uncoupled from functional lines of the circuit part; and
verifying a logic output value of the logic circuit responsive to the test patterns,
the method being performed when the program code is executed on a computer.

* * * * *